(12) United States Patent
Taylor et al.

(10) Patent No.: US 8,072,356 B2
(45) Date of Patent: Dec. 6, 2011

(54) CAPACITIVE SENSING USER INTERFACES AND IMPLEMENTATION THEREOF

(75) Inventors: John P. Taylor, San Diego, CA (US); Jeffrey M. Thoma, San Diego, CA (US)

(73) Assignee: Kyocera Corporation, Kyoto (JP)

(*) Notice: Subject to any disclaimer, the term of this patent is extended or adjusted under 35 U.S.C. 154(b) by 1026 days.

(21) Appl. No.: 11/956,158

(22) Filed: Dec. 13, 2007

(65) Prior Publication Data

US 2010/0277351 A1 Nov. 4, 2010

(51) Int. Cl.
*H03M 11/00* (2006.01)

(52) U.S. Cl. ............... 341/33; 341/20; 341/26; 200/600

(58) Field of Classification Search .............. 341/20–35; 324/600, 649, 658, 676, 678; 200/600
See application file for complete search history.

(56) References Cited

U.S. PATENT DOCUMENTS

| | | | |
|---|---|---|---|
| 4,550,221 A | 10/1985 | Mabusth | |
| 4,733,222 A | 3/1988 | Evans | |
| 4,736,191 A | 4/1988 | Matzke et al. | |
| 5,572,205 A | 11/1996 | Caldwell et al. | |
| 5,594,222 A | 1/1997 | Caldwell | |
| 5,730,165 A | 3/1998 | Philipp | |
| 5,790,107 A | 8/1998 | Kasser et al. | |
| 5,841,078 A | 11/1998 | Miller et al. | |
| 5,861,583 A | 1/1999 | Schediwy et al. | |
| 5,933,102 A * | 8/1999 | Miller et al. | ............... 341/33 |
| 6,452,514 B1 | 9/2002 | Philipp | |
| 7,145,552 B2 | 12/2006 | Hollingsworth | |
| 7,847,614 B2 * | 12/2010 | Taylor | ............... 327/384 |
| 2004/0003949 A1 | 1/2004 | Lin | |
| 2004/0246239 A1 | 12/2004 | Knowles et al. | |

FOREIGN PATENT DOCUMENTS

WO WO 00/44018 7/2000

OTHER PUBLICATIONS

QRG Ltd. "QMatrix(TM) Panel Design Guidelines." Oct. 10, 2002. http://www.qprox.com/downloads/appnotes/an-kd01_qmatrix_design_rules.pdf.

* cited by examiner

Primary Examiner — Timothy Edwards, Jr.
Assistant Examiner — Franklin Balseca

(57) ABSTRACT

Methods and apparatus for determining the operating states of a plurality of capacitive sensing buttons in a capacitive sensing user interface are disclosed. The capacitive sensing buttons are sampled in a round-robin fashion such that the decay time samples for the buttons are acquired in an interleaved manner during each sampling cycle. Provisions are made to reduce the initialization delay, to reduce transient-induced errors, and to obtain the operating states based on updated decay data samples for the buttons.

20 Claims, 12 Drawing Sheets

CAPACITIVE SENSING USER INTERFACES AND IMPLEMENTATION THEREOF

FIELD OF THE INVENTION

The invention relates to capacitive sensing user interfaces for use in electronic devices.

BACKGROUND

Switches utilizing capacitive sensing user interfaces have been utilized in various electronic devices and electromechanical devices, such as cellular phones, audio/video players, and elevators. These switches may implement various functions, including simple on/off state functions. Without moving parts, switches utilizing capacitive sensing user interfaces typically have higher durability and better resistance to contaminants than other types of switches, such as dome-switches, mechanical-switches, etc.

A capacitive sensing user interface for implementing a switch may include a set of capacitive sensing elements, e.g., capacitive sensing buttons, keys, or switches, as discussed with reference to FIGS. 1A-B. FIG. 1A illustrates a schematic representation of a top view of a capacitive sensing button 100, hereinafter "button 100"; FIG. 1B illustrates a cross-sectional view of button 100.

Button 100 may include an anode/sensor 102 and a cathode/ground 104, both typically made of a conductive material, such as copper. Anode 102 may be coupled with a signal source (e.g., a voltage or a current source) and may receive charge from the signal source through a conductive trace 112 (shown in FIG. 1B). Cathode 104 may be disposed such that a gap 106 exists between anode 102 and cathode 104. Accordingly, anode 102 and cathode 104 may form a capacitive device.

Button 100 may also include a substrate 110 for supporting anode 102 and cathode 104. Substrate 110 may represent a flex circuit board and may be made of polyimide, such as Kapton® available from E. I. du Pont de Nemours and Company, www.dupont.com. Button 100 may also include a cover or lens 108 for providing mechanical, environmental, and/or electrostatic discharge (ESD) protection for button 100.

A human finger typically has higher conductivity than the air surrounding button 100 and in gap 106. Therefore, if a finger is in the vicinity of button 100, for example, touching lens 108, the capacitance between anode 102 and cathode 104 may increase. By appropriately detecting the increase in capacitance due to the presence of the human finger, a switch may thus be implemented by the capacitive sensing interface of FIGS. 1A and 1B.

Although only a single button 100 is discussed in connection with FIGS. 1A and 1B, it should be understood that a capacitive sensing user interface may include any number of capacitive sensing buttons, similar to button 100, for activating (and deactivating) a set of functions of an electronic or electromechanical device.

To further elaborate, FIG. 2A illustrates a schematic representation of an example state-determining circuitry of a representative capacitive sensing user interface system 200, hereinafter "user interface 200." User interface 200 may include, for illustration, a capacitive sensing button 202, representing a single button of the capacitive sensing user interface. Another capacitor 234 is also shown, representing the capacitive effect experienced when the user's finger is in the vicinity of user interface 200.

User interface 200 may further include state-determining logic comprising a driver 212, a comparator 208, an AND gate 220, a timer 218 (or counter 218), and a processor/controller 216. Generally speaking, the state-determining logic operates in two phases: the precharge phase and the discharge phase. These two phases (i.e., precharge phase and discharge phase) are shown in FIG. 2B. The state-determining logic charges up the capacitor during the precharge phase and monitors during the discharge phase the rate at which the voltage on the capacitor's plate decays. From the rate of decay of the capacitor's plate voltage, the state-determining logic then determines whether a user's finger is present in (or absent from) the vicinity of the switch associated with that capacitor. The operation of the state-determining logic of FIG. 2A will now be discussed in connection with the signals of FIG. 2B, which are obtained at various nodes (e.g. node 222) of the state-determining circuitry illustrated in the example of FIG. 2A.

Generally speaking, driver 212 is coupled to receive a supply voltage $V_{DD}$ from a voltage or current source (not shown to simplify the illustration). At the start of the precharge phase, DIR signal 230 is set to high (as evidenced by the low-to-high transition 250 of the DIR signal in FIG. 2B). As long as the DIR signal 230 is high, driver 212 provides this supply voltage $V_{DD}$ to node 222 to charge up capacitor 202. With reference to FIG. 2B, the high state of DIR signal 230 is shown by reference number 292. With driver 212 supplying supply voltage $V_{DD}$ to node 222 during the precharging phase (characterized by the high DIR signal in FIG. 2B), the voltage at node 222 is shown rising over time to a voltage level 294 (i.e., some voltage level at or below $V_{DD}$), reflecting the fact that capacitor 202 is charged during the time when DIR signal 230 is high. During this precharging period, the counter of counter circuit 218 is set to zero to prepare for counting during the subsequent discharge period.

At some point in time, a processor turns off DIR signal 230, as evidenced by the high-to-low transition edge 256 of DIR signal 230 in FIG. 2B. Turning off DIR signal 230 begins the discharge phase and activates counter 218 to begin counting as will be discussed later herein.

With DIR signal 230 turned off, driver 212 no longer supplies $V_{DD}$ to node 222 of FIG. 2A. Node 222, which is coupled to capacitor 202 and is charged up prior to DIR signal 230 being turned off, now begins to discharge through a resistor 232. This discharge causes the voltage level at node 222 to gradually decay (as seen by the downward slope 258 of signal V222 in FIG. 2B).

Since node 222 is input into comparator 208 to compare the voltage at node 222 (V222) against a threshold voltage $V_{TH}$, the output of comparator 208 will be high during the time that the voltage at node 222 (V222) exceeds the threshold voltage $V_{TH}$. On the other hand, the output of comparator 208 will be low when the voltage at node 222 (V222) decays to below the threshold voltage $V_{TH}$. Generally speaking, the threshold voltage $V_{TH}$ for a given button may depend on factors such as, for example, the component sizes, the construction details, and the materials employed that are specific to that given button.

In the example of FIGS. 2A and 2B, comparator 208 is implemented to output the comparison result only during the discharge phase, resulting in the comparator output 224 signal shown in FIG. 2B. In this implementation, the output of comparator 208 goes high at edge 260 the start of the discharge phase (coincident with falling edge 256 of DIR signal 230) and stays high until the voltage at node 222 (V222) falls below the threshold voltage value $V_{TH}$. When the voltage at node 222 (V222) crosses the threshold value $V_{TH}$ (shown by reference number 262 on the V222 signal of FIG. 2B), comparator output 224 goes low at edge 264.

With reference to the circuit diagram of FIG. 2A, note that the output 224 of comparator 208 is inputted into an AND gate 220. The operation of AND gate 220 is such that when both comparator output 224 and a periodic clock signal 236 are high, a high output is produced at AND output 238. This situation occurs during the high portions 270, 272, 274, 276, 278, and 280 of periodic clock signal 236 in FIG. 2B since comparator output 224 is also high during that time. The resultant signal for AND output 238 is shown in FIG. 2B, showing six pulses 280-290 to mirror the six clock cycles 270-280 of 236 during the time comparator output 224 is also high. Counter 218, which is activated by way of Enable signal 240 at the start of the discharge phase to begin counting, will count these six pulses 280-290 and derive from the period of 236 the decay time it took for the voltage at node 222 (V222) to decay from its charged value to threshold voltage $V_{TH}$. If the period of 236 is about 10 ms, the six pulses will be about 60 ms, for example. Accordingly, the decay time sample is 60 ms.

An alternate implementation may have comparator 208 outputting a high value as soon as the voltage at node 222 (V222) exceeds threshold voltage $V_{TH}$ during the precharge phase. This implementation (which is not shown in FIG. 2B) may result in AND gate outputting pulses before the start of the discharge phase (i.e., as soon as the output of comparator 208 goes high). However, since counter 218 does not start counting until the start of the discharge phase, only six pulses 280-290 will be counted, and the result is the same as far as the value of the decay time.

Note that even though only one capacitor 202 is shown in FIG. 2A, multiple capacitors implementing multiple capacitive sensing switches may be provided. Using an appropriate multiplexing circuit and a selector signal (which may be controlled by processor 216), individual capacitors may be polled for their decay times.

So far, the capacitance effect of the user's finger being in the vicinity of the capacitor sensing interface (e.g., capacitor 202 of FIGS. 2A and 2B) has not been discussed. This capacitance effect is modeled in FIG. 2A by parallel capacitor 234 and is now discussed with reference to FIG. 2C hereinbelow.

FIG. 2C illustrates the use of a decay time sample to determine the on/off state of a given button. In the absence of the user's finger, curve section 252 may represent the decay of voltage V at node 222 (see FIG. 2A) after supply voltage $V_{DD}$ is removed from node 222. On the other hand, when a user's finger is present in the vicinity of the capacitive sensing interface, curve section 254 may represent the decay of voltage V at node 222 after supply voltage $V_{DD}$ is removed from node 222.

Since the presence of the user's finger tends to increase the capacitance of the button, it may take a longer time during the discharge phase for voltage V at node 222 to decay from its charged value (which is charged up during the precharge phase as discussed earlier) to threshold voltage value $V_{TH}$. Accordingly, as illustrated in the example of FIG. 2C, a decay time $t_p$ associated with the presence of the finger is greater than a decay time $t_a$ associated with the absence of the finger. By comparing the decay time sample measured for a button with a threshold characteristic time $t_{TH}$, it is possible to detect whether a user's finger is present near a capacitive sensing button or whether the user's finger is absent.

Generally speaking, as in the case with the threshold voltage $V_{TH}$, the threshold characteristic time $t_{TH}$ may be predefined for each button. The threshold characteristic time $t_{TH}$ for a given button may depend on factors such as, for example, the component sizes, the construction details, and the materials employed that are specific to that given button. When a decay time sample is greater than $t_{TH}$, the button is deemed to be activated by the user, and the function associated with the button is activated (e.g., the on state). When the decay time sample is less than $t_{TH}$, the button is deemed to be not activated by the user. Accordingly, the function associated with that button is not activated (e.g., the off state).

It is generally known, however, that there may exist various ambient and/or transient noises in the operating environment of capacitive sensing user interfaces. For example, there may be noises generated by the radio frequency (RF) circuitry in a cellular phone or by the 60 Hz AC line voltage in a typical home or office/factory environment.

If a single decay time sample is employed for determining the on/off state of a button, random transient noises (such as noises from a nearby radio frequency (RF) circuit or 60 Hz line voltage) may unduly affect the accuracy of the on/off state determination. This is because the presence of transient noises may momentarily increase the capacitive value of a given button. If the decay time sample for that button happens to be measured while the button is affected by transient noises, the resultant on/off state determination may be erroneous. For example, it is possible that the on/off state-determining logic may misinterpret the increase in the decay time sample due to transient noises as "user's finger present" and may deem the switch to be activated by the user even though the user's finger is nowhere near the capacitive sensing button of that switch.

To ameliorate the error-inducing effects of transient noises, multiple decay time samples may be sampled consecutively and statistically processed (e.g., averaged) for a capacitive sensing button before the on/off state determination is undertaken. With reference to FIG. 2B, DIR signal 230 may be turned on and off multiple times for each capacitive sensing button to generate multiple decay time measurements (with each decay time measurement comprising a plurality of pulses) for that button. With reference to FIG. 2A, multiple decay time samples may be received from counter 218 and averaged by processor/controller 216 to determine the on/off state of the button.

Since it is unlikely that transient noises may last long enough to affect multiple decay time sample measurements, the error-inducing effect of transients on the state determination process may be reduced simply by taking multiple decay time samples for each button before determining the on/off state of for that button. On the other hand, since a human finger moves relatively slowly, the detection of a long decay time in multiple decay time measurements are likely to indicate the presence of a user's finger.

To elaborate, suppose six hypothetical consecutive decay time samples for a hypothetical capacitive sensing button are obtained for capacitor 202 of FIG. 2A. The values of the decay time samples may be 10 microseconds, 12 microseconds, 14 microseconds, 184 microseconds, 16 microseconds, and 17 microseconds. In this case, since the long decay time sample occurs only once, it is likely that the increase in decay time of 184 microseconds is due to a transient event. In this case, the processor may simply average out the anomalous sample or may ignore the anomalous sample altogether. On the other hand, if the decay time samples are 10 microseconds, 180 microseconds, 192 microseconds, 188 microseconds, 174 microseconds, 190 microseconds, the fact that five out of six decay time samples show a long decay time is probably indicative of the presence of a user's finger in the vicinity of the capacitive sensing button.

FIG. 3 illustrates an example prior art scheme for determining on/off states of capacitive sensing buttons utilizing multiple consecutive decay time samples for each button. In the example of FIG. 3, curve sections 302-304 may represent the voltage decay associated with button 202 in multiple decay sampling cycles. Curve sections 306-308 may represent voltage decay associated with a different button 204 in multiple decay sample cycles, and curve sections 310-312 may represent voltage decay associated with a different button 206 in multiple decay sampling cycles Decay time samples 322-324 may be acquired consecutively and then averaged to determine the on/off state of button 202. The process may then continue in a round-robin fashion with button 204 and button 206. For example, after the on/off state of button 202 is determined, decay time samples 326-328 may be consecutively acquired and then averaged to determine the on/off state of button 204. After the on/off state of button 204 is determined, decay time samples 330-332 may be consecutively acquired and then averaged to determine the on/off state of button 206.

There are, however, disadvantages associated with the prior art method for determining on/off states of capacitive sensing buttons. As illustrated in the example of FIG. 3, the on/off state of button 206 may not be determined until after a substantial period of time, including the time needed to acquire multiple decay time samples for button 202 and button 204, has elapsed. Thus, in the example of FIG. 2, at least four decay time determining cycles (associated with decay time samples 322, 324, 326, and 328 for buttons 202 and 204) elapse before button 206 has its turn to have its on/off state determined. Although the example of FIG. 3 measures only two decay time samples for each button, if a greater number decay time samples per button is desired (e.g., 6 or 20 decay time samples for each button), button 206 may have to wait for a significant amount of time before its turn to have the on/off state of its button determined. In the electronic device application, if the delay in determining the on/off state for a button is longer than a certain period of time, such as 20 ms for example, that delay may be perceived by a user of the capacitive sensing user interface. As a result, the user may perceive the electronic device as "slow" or "unresponsive" and the user experience may not be satisfactory.

Further, if there exists a noise which substantially overlaps the time during which the multiple decay time samples for a given button are acquired, that noise may significantly affect the accuracy of decay time determination and may tend to cause false positives or false negatives (or incorrect state determination in general) for that given button. This is so even if multiple decay time samples are acquired and averaged before the on/off state determination is made. For example, if a quasi-periodic noise tends to concentrate between time $t_r$ and time $t_x$ of example FIG. 3, the quasi-periodic noise overlaps the multiple decay time samples acquired for button 202 and may cause false positives with respect to button 202 even if multiple decay time samples are obtained and averaged before the on/off state of button 202 is determined.

SUMMARY

The invention relates, in an embodiment, to a method in an electronic device for determining operating states of a plurality of capacitive sensing elements. The plurality of capacitive-sensing elements includes at least a first capacitive sensing element and a second capacitive sensing element. The first capacitive sensing element has an associated first steady-state number of decay time samples employed for determining an operating state of the first capacitive sensing element during steady-state operation. The second capacitive sensing element has an associated second steady-state number of decay time samples employed for determining an operating state of the second capacitive sensing element during the steady-state operation.

The method includes acquiring, in an interleaved manner, a first plurality of decay time samples for the first capacitive sensing element and the second capacitive sensing element, wherein a maximum consecutive number of decay time samples acquired for the first capacitive sensing element in the first plurality of decay time samples is less than the first steady-state number of decay time samples and wherein a maximum consecutive number of decay time samples acquired for the second capacitive sensing element in the first plurality of decay time samples is less than the second steady-state number of decay time samples.

The method also includes determining the operating state of the first capacitive sensing element using at least decay time samples acquired for the first capacitive sensing element in the first plurality of decay time samples, wherein the operating state of the first capacitive sensing element affects an operating characteristic of at least one function of the electronic device.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1A:
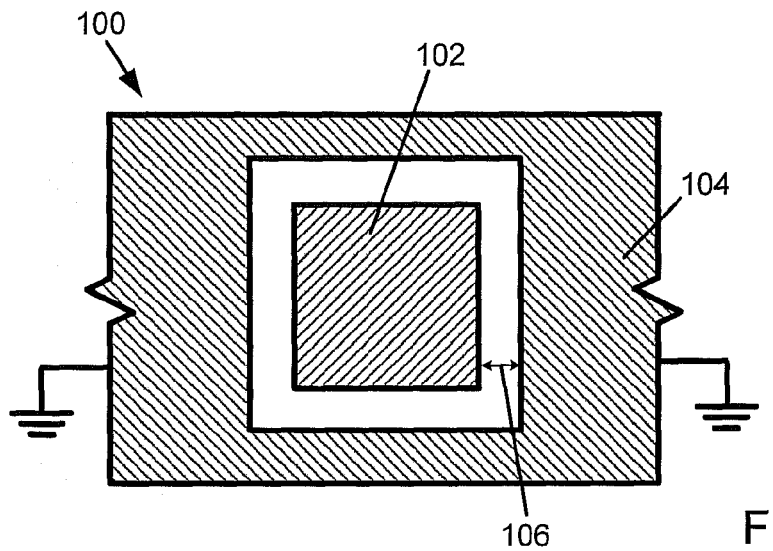
FIG. 1A illustrates a schematic representation of a top view of a capacitive sensing button.
Figure 1B:
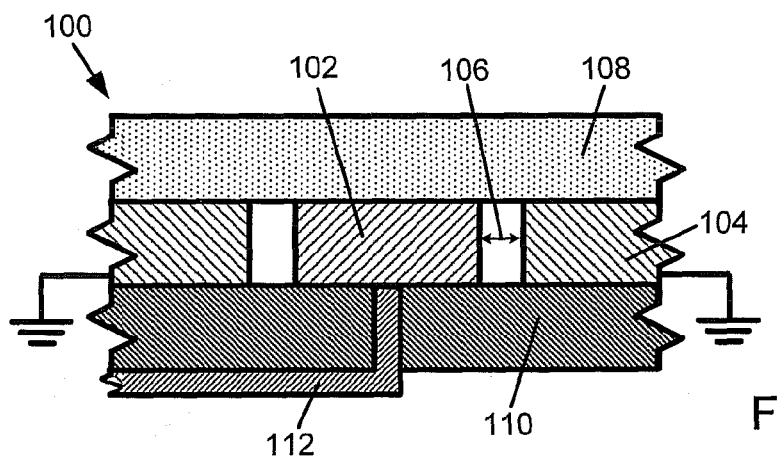
FIG. 1B illustrates a cross-sectional view of the capacitive sensing button.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover an article of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable circuits adapted for the various operations pertaining to embodiments of the invention.

Embodiments of the invention relate to improved methods and apparatus for determining the operating states (such as on/off states) of a plurality of capacitive sensing buttons in a capacitive sensing user interface. Since the operating state of a button affects the operating characteristic of one or more functions of an electronic device (such as a button push triggering a "volume up" function in a cellular phone or generating a dialed digit), improving the apparatus and/or process for determining the operating states of the buttons tends to improve the user experience by providing more accurate and more timely function activation.

In an embodiment, the capacitive sensing buttons are sampled in a round-robin fashion such that each button is sampled once during a given sampling cycle. After all buttons are sampled, a new sampling cycle is started and all buttons are again sampled in a round-robin fashion, with each button being sampled one at a time in the new sampling cycle. These cycles continue cycle-after-cycle to update, in an interleaved manner, the on/off state data samples (e.g., decay time samples or charge time samples) for the plurality of capacitive sensing buttons. In the following description, decay time samples are recited to facilitate discussion of embodiments, though other types of data sample may be utilized in one or more embodiments to determine the operating states.

As the term is employed herein, interleaving indicates that the decay time samples are acquired for all buttons during a given sampling cycle, with no single button consecutively acquiring all its requisite decay time samples during any given sampling cycle. For example, if the algorithm requires 12 decay time samples for the purpose of calculating decay time averages during steady state operation, embodiments of the invention may interleave the decay time sampling such that during a given sampling cycle, all buttons acquire only one decay time sample. Over the course of 12 cycles, all buttons would acquire all their required 12 decay time samples. Once all required decay time samples are acquired the steady state is entered in which a moving window of 12 latest decay time samples are maintained for the purpose of calculating averages and determining button operating state.

As another example, embodiments of the invention may interleave the decay time sampling such that during a given sampling cycle, all buttons acquire only two decay time samples. Over the course of 6 cycles, all buttons would acquire all their required 12 decay time samples.

As noted from the above, embodiments of the invention differ from the prior art in that all steady-state decay time samples for a given button are not acquired consecutively before the decay time samples for another button are acquired. For example, if there are 3 buttons A, B, and C and each button requires 12 decay time samples (i.e., the steady state number of decay time samples is 12), the prior art may acquire 12 decay time samples for button A before acquiring decay time samples for button B. In contrast, embodiments of the invention allow each of buttons A, B, and C to acquire one decay time sample in cycle 1, and then allow each of buttons A, B, and C to acquire another decay time sample in cycle 2, and so on.

By interleaving the decay time sampling across multiple buttons instead of acquiring all decay time samples consecutively for each button at a time, the effect of transient noises may be more evenly distributed across multiple buttons. For example, if there exists a transient noise that affects multiple decay time samples, the interleaving of the decay time sampling across multiple buttons allows the effect of the transient noise to be distributed among the multiple buttons instead of unduly affecting any single button. With reference to the above example, if a transient noise affects three decay time samples, the prior art technique may result in button A experiencing the transient noise error in three of its consecutively acquired decay time samples. In contrast, embodiments of the invention distribute the transient time error among three buttons A, B, and C in a sampling cycle by interleaving the samples among the buttons, thereby avoiding unduly affecting the accuracy of any single one button.

In an embodiment, the decay time samples for each button are tracked in a rolling array of values. In a given rolling array, decay time samples are acquired in a first-in-first-out manner such that when a new decay time sample (or an updated decay time sample) is acquired and inputted into the rolling array, the oldest time decay time sample (or a previous decay time sample) is discarded from the rolling array. Thus the rolling array of a given button tracks the set of most-recently-acquired decay time samples for that button and maintains during steady state operation a steady state number of most-recently-acquired decay time samples. These most-recently-acquired decay time samples are then statistically processed (e.g., averaged) to ameliorate the effect of transient noise. The computed decay time sample average is then compared with the threshold characteristic time $t_{TH}$ for that button to determine the on/off state of the button.

In an embodiment, average computation does not begin until the rolling array is completely filled. In other words, the capacitive sensing user interface does not output on/off state data for a given button until the requisite steady state number of decay time samples is acquired for that given button. This approach ensures that a transient error that affects a decay time sample does not unduly influence the on/off state determination. Under this approach, during the initialization period when the multiple rolling arrays associated with the multiple buttons are filled in a round-robin manner, no on/off state data is outputted. After the rolling array for a given button is filled, average computation may be performed to output an average time decay sample value to facilitate comparison against the threshold characteristic time $t_{TH}$. The result of the comparison determines the on/off state of that given button.

With reference to the above example in which each of three buttons A, B, and C has a respective rolling array of 12 elements, average computation for button A may be performed after the rolling array associated with button A is filled with 12 decay time samples.

Speaking from the user's perspective, the aforementioned approach may result in a perceptible delay during the initialization period when no on/off state data is produced irrespective of user finger positioning. However, such initialization delay only occurs once. After the rolling array for a given button is filled with actually acquired decay time samples (at which point the steady state of operation is entered), a new decay time sample may replace the oldest decay time sample in the rolling array to update the rolling array for that given button, and average computation may be performed immediately using the updated rolling array values.

In an embodiment, the initialization delay may be reduced by computing the average value as the decay time samples are acquired for each button. For example, if only seven decay time samples have been actually acquired for button A, it is possible, in an embodiment, to proceed with the computation of the average decay time value based on the available seven actually acquired decay time samples instead of having to wait until all 12 decay time samples are acquired. Although average computation based on only seven actually acquired decay time samples may reduce the error-dampening effect that 12 decay time samples may offer, the tradeoff is a shorter initialization delay.

Although the examples herein discuss the scenario wherein only one decay time sample is acquired for each button during a sampling cycle, it is possible to acquire multiple decay time samples for each button during a given sampling cycle. For example, two or three consecutive decay time samples may be acquired for a given button before the next button has its decay time samples acquired. In other words, wherein the prior art requires all decay time samples for a button to be consecutively acquired before the next button may have its decay time samples acquired, embodiments of the invention may acquire only a subset (which may be 1, 2, or more) of the required steady state decay time samples per button during a sampling cycle. In other words, the interleaving is not limited to one decay time sample per button per sampling cycle. It is possible to obtain N decay time samples per button per sampling cycle whereby N is an integer value that is less than the steady state number of decay time samples employed for average calculation when the rolling array is completely filled.

The features and advantages of the invention may be better understood with reference to the figures and discussions that follow.

Figure 4:
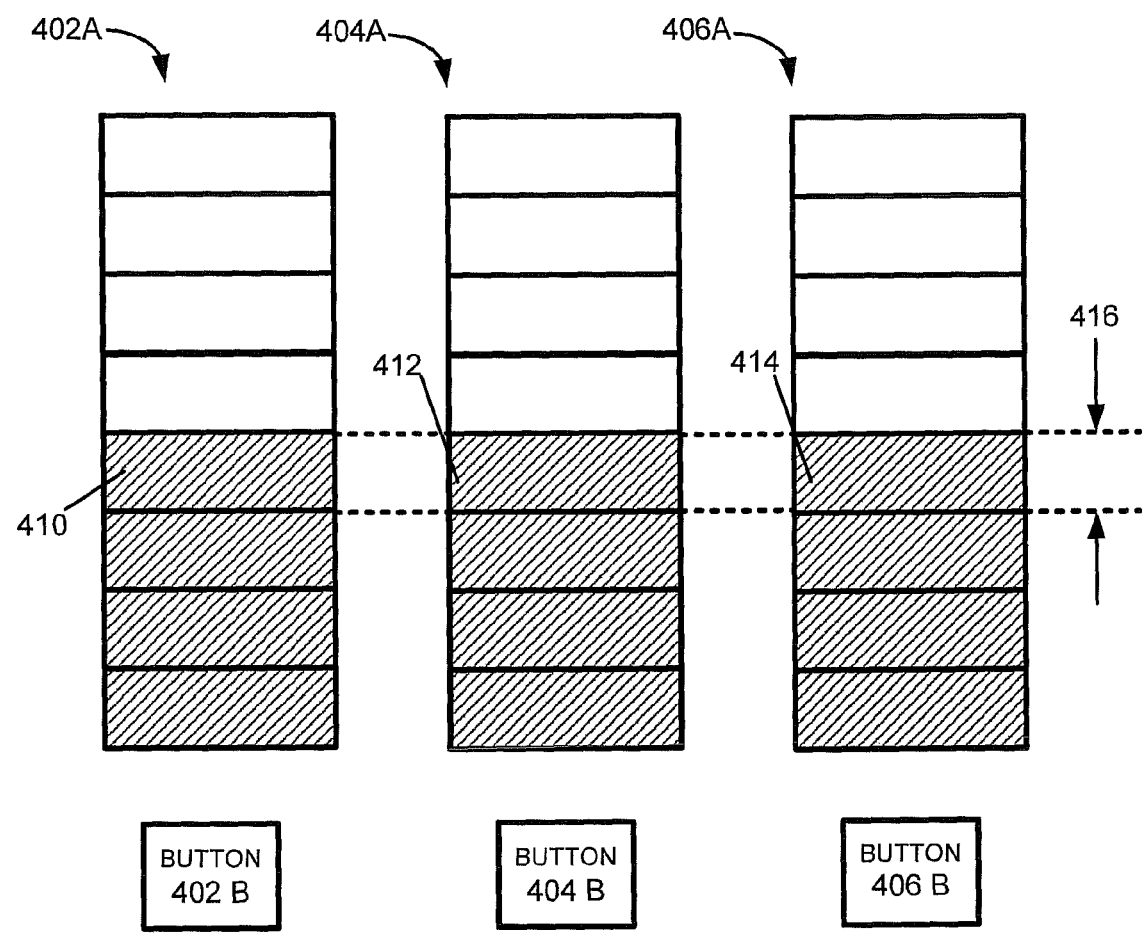
FIG. 4 shows, in accordance with an embodiment of the invention, a plurality of rolling arrays associated with a set of buttons.

FIG. 4 shows, in accordance with an embodiment of the invention, a plurality of rolling arrays 402A, 404A, and 406A associated with buttons 402B, 404B and 406B respectively. Although arrays are only one example data structure type employed to store decay time samples for the buttons, the concepts presented in FIG. 4 nevertheless are useful to understand some relevant points regarding embodiments of the present invention.

In the example of FIG. 4, it is assumed that 8 decay time samples are employed for error-mitigating purposes. For each button, 8 decay time samples will be processed to generate an error-mitigated decay time sample. For example, 8 decay time samples may be averaged to mitigate the error that may arise due to the presence of a transient condition affecting one or more decay time samples.

As seen in FIG. 4, each of rolling arrays 402A, 404A and 406A has 8 array members, with each array member employed to store a decay time sample. In the example of FIG. 4, each of rolling arrays 402A, 404A, and 406A has acquired 4 decay time samples since system initialization (denoted by the four shaded portions in each rolling array). Note that unlike the prior art, embodiments of the invention do not wait until rolling array 402A (associated with button 402B) to be filled up with decay time samples before acquiring decay time samples for other buttons. Also note that the decay time sample acquisition is interleaved in the sense that the decay time samples for the plurality of buttons (such as consecutive decay time samples 410, 412 and 414 for buttons 402B, 404B, and 406B) are acquired during a given sample cycle 416, with each cycle occurring in a cyclical fashion. In the next cycle, three more decay time samples will be acquired for the three buttons, and so on.

Figure 5:
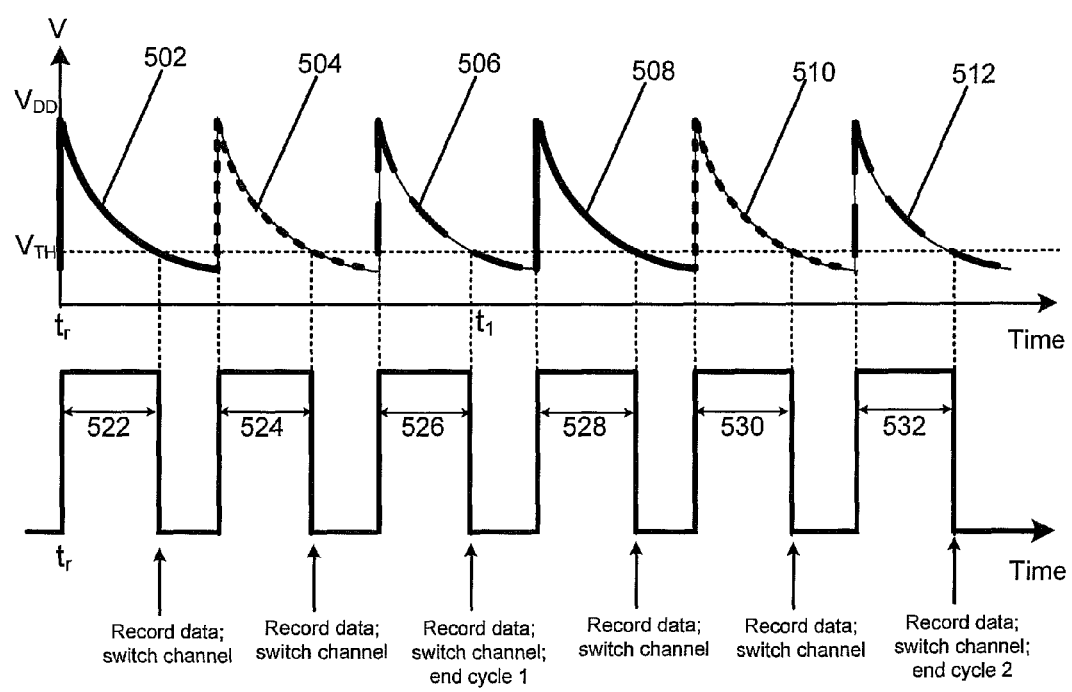
FIG. 5 illustrates, in accordance with one or more embodiments of the present invention, a capacitive sensing element (e.g., button) decay time sampling scheme.

FIG. 5 illustrates a capacitive sensing element (e.g., button) decay time sampling scheme in accordance with one or more embodiments of the present invention. In one or more embodiments, a processor/controller may interleave decay time sampling for multiple buttons. Decay time samples associated with the buttons may be acquired in a cyclical fashion in a given sampling cycle to prevent the effect of system noises from concentrating on a certain button or a few buttons. In one or more embodiments, the sequence for acquiring decay time samples may be randomized to further mitigate the effect of noises.

As illustrated in the example of FIG. 5, curves 502 and 508 may represent voltage decay associated with a first button, curves 504 and 510 may be associated with a second button, and curves 506 and 512 may be associated with a third button. Accordingly, decay time samples 522, 524, and 526 may be associated with the first button, the second button, and the third button, respectively, and are acquired sequentially in cycle 1, or a first sampling cycle. Further, data samples 528, 530, and 532 may be associated with the first button, the second button, and the third button, respectively, and are acquired sequentially in cycle 2, or a second sampling cycle.

As illustrated, a decay time sample may represent the time for the voltage associated with a certain button to decay from its precharged state (e.g., about the voltage level of a supply voltage $V_{DD}$) to a threshold voltage $V_{TH}$. In one or more embodiments, a decay time sample may represent the time for the voltage associated with a certain button to increase from an initial level to a threshold level.

As can be appreciated from the example of FIG. 5, decay time samples for the three buttons are acquired in an interleaved and cyclical fashion. In one or more embodiments, the decay time samples may be acquired in a randomized sequence, as mentioned. The cycles may continue indefinitely, with the newest decay time sample data replacing the oldest decay time sample data for the buttons in each cycle.

As can be appreciated from the example of FIG. 5, even if a transient noise occurs between a time $t_r$ and a time $t_1$, the effect of the transient noise on the decay time sampling may be distributed among the three buttons instead of unduly affecting any single button.

Figure 2A:
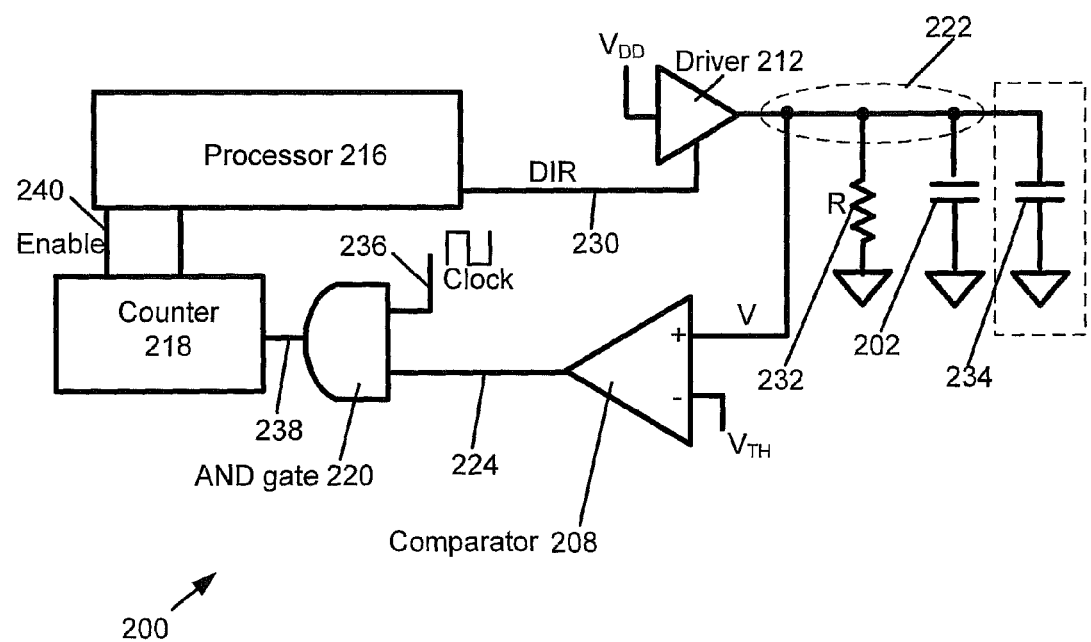
FIG. 2A illustrates a schematic representation of an example state-determining circuitry of a representative capacitive sensing user interface system.
Figure 2B:
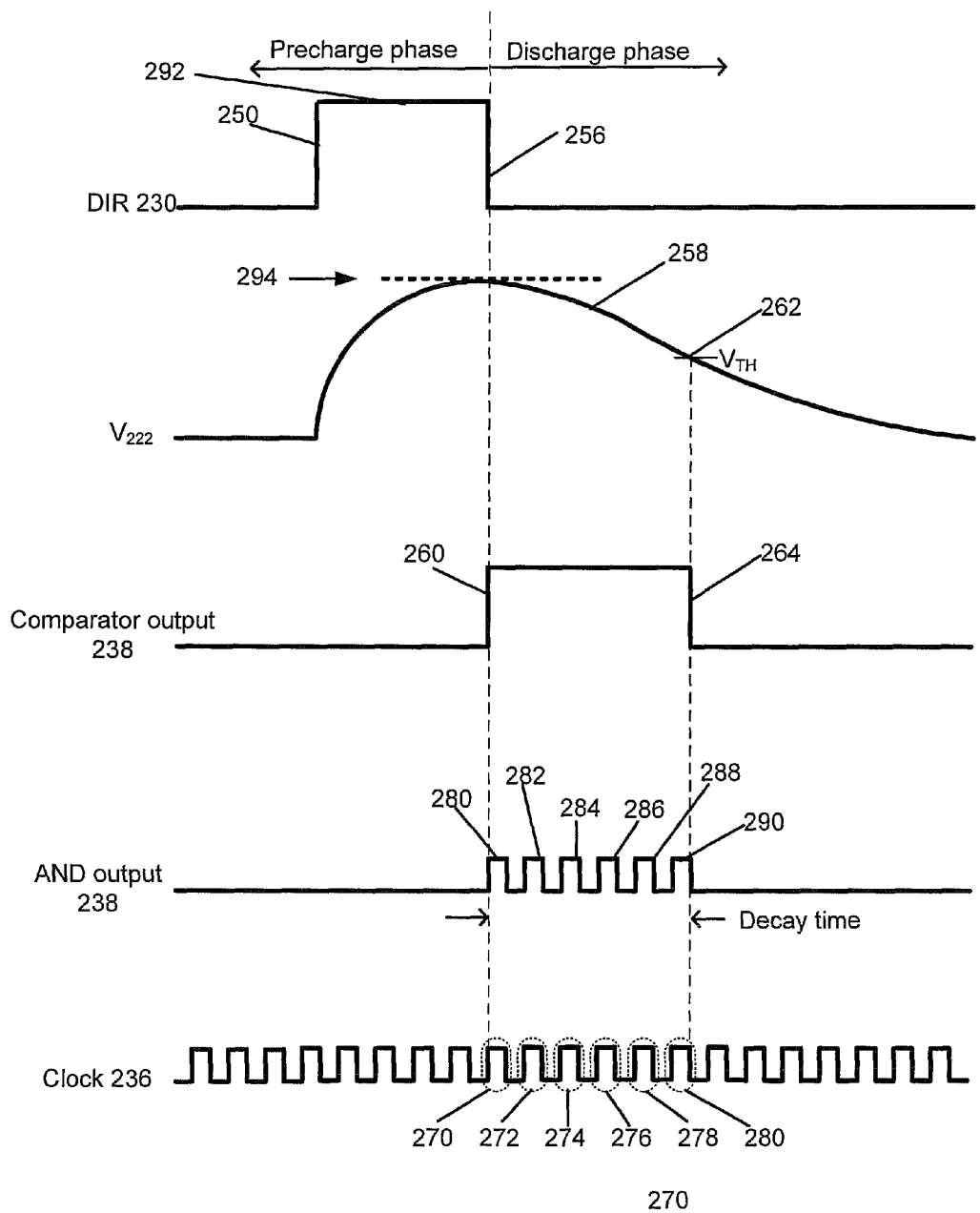
FIG. 2B illustrates schematic representations of example signals pertaining to operation of the example-determining circuitry illustrated in the example of FIG. 2A.
Figure 2C:
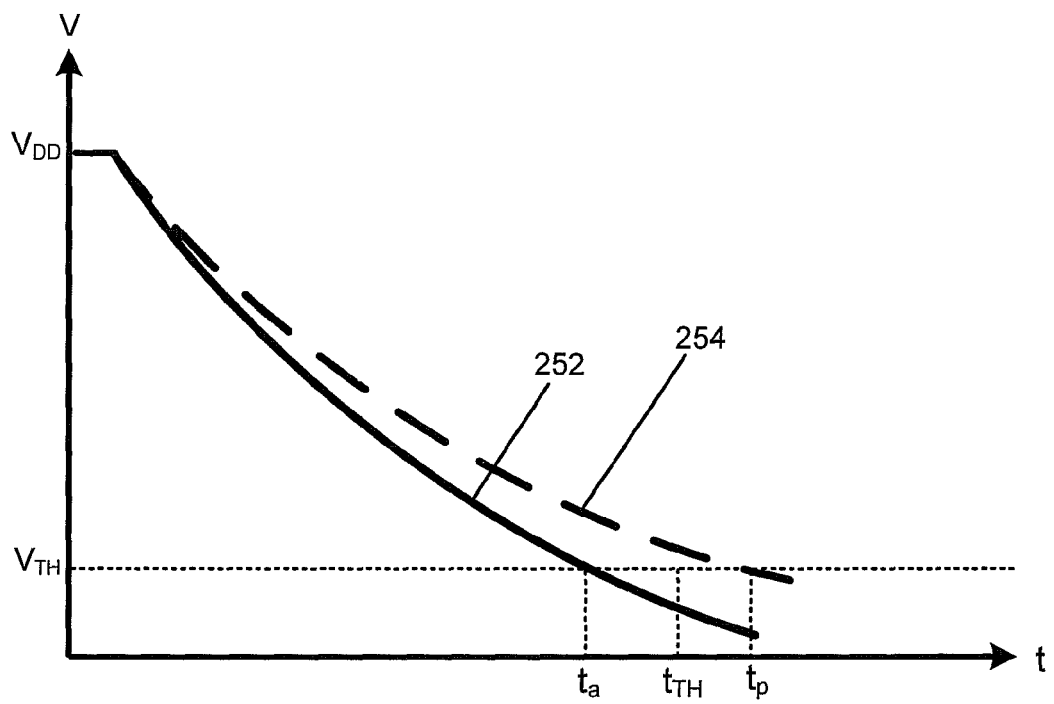
FIG. 2C illustrates the use of a decay time sample to determine the on/off state of a given button.
Figure 3:
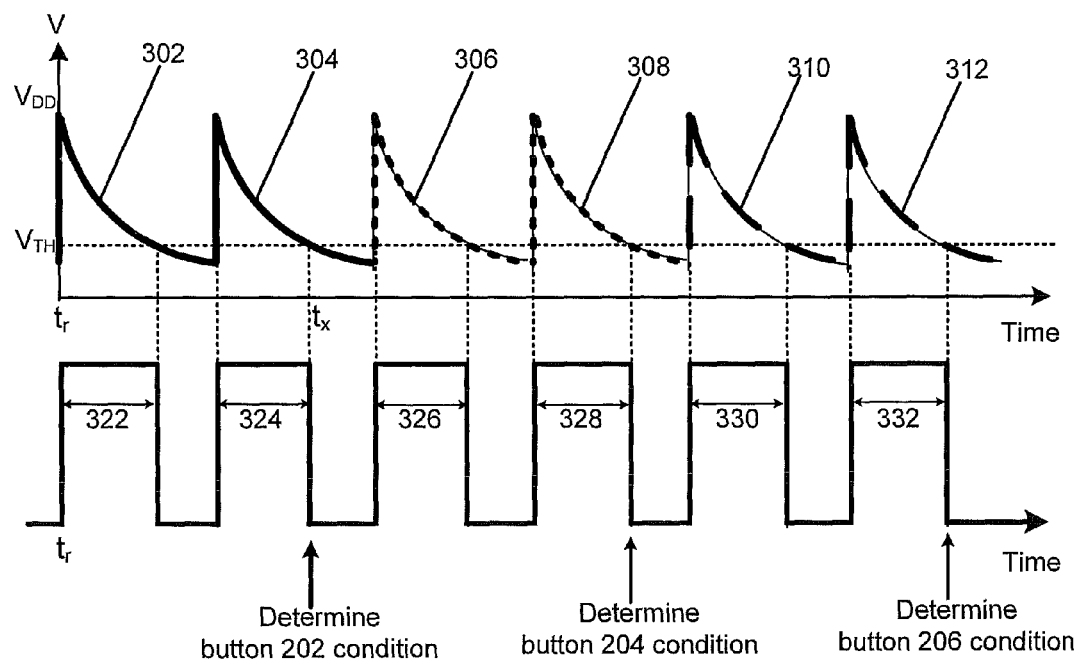
FIG. 3 illustrates an example prior art scheme for determining on/off states of capacitive sensing buttons utilizing multiple consecutive decay time samples for each button.
Figure 6:
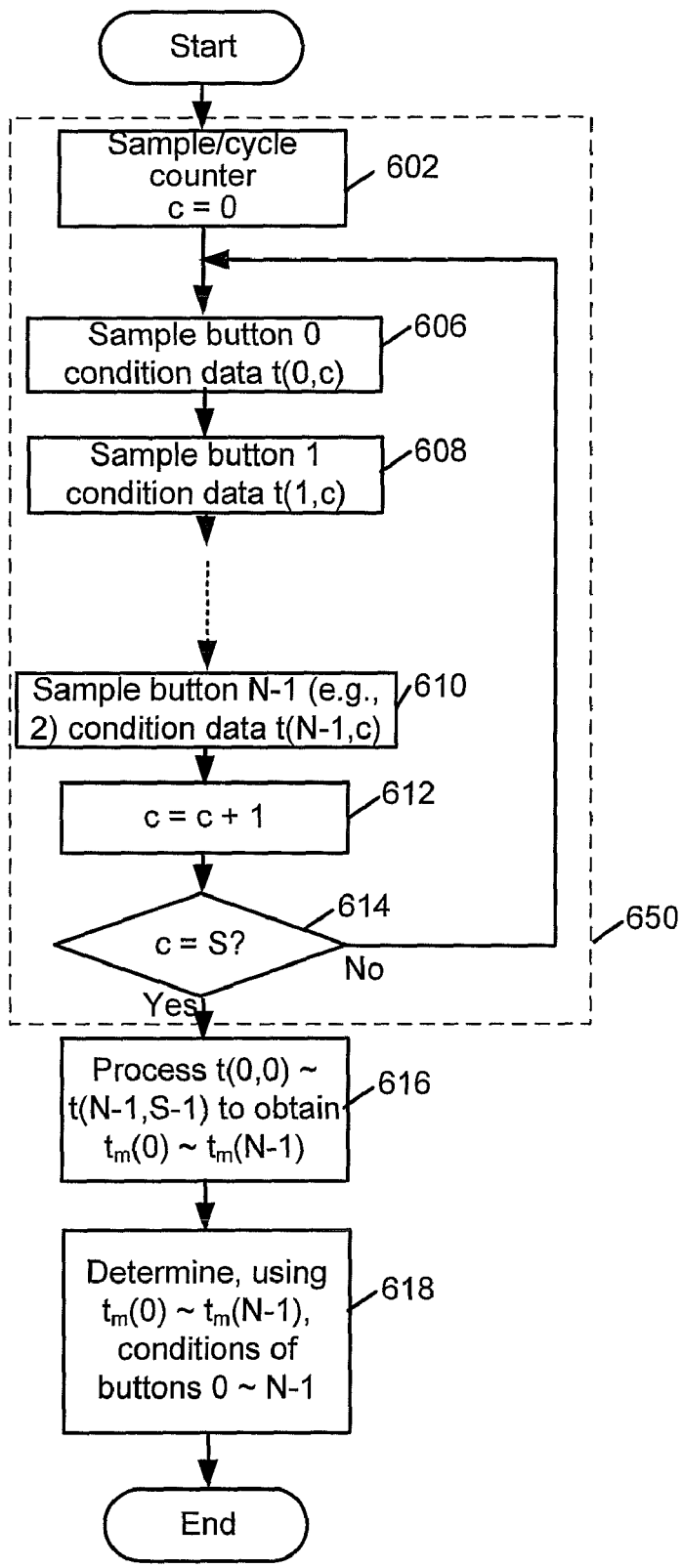
FIG. 6 illustrates, in accordance with one or more embodiments of the present invention, a flowchart of a method for determining the states of N (a plural number, e.g., 3) capacitive sensing element utilizing S (a plural number, e.g., 32) decay time samples for decay time sample averaging.

FIG. 6 illustrates, in accordance with one or more embodiments of the present invention, a flowchart of a method for determining the states of N (a plural number, e.g., 3) capacitive sensing element utilizing S (a plural number, e.g., 32) decay time samples for decay time sample averaging. The method may be utilized in a user interface system that includes a similar arrangement as user interface 200 illustrated in the example of FIG. 2A.

In the example of FIG. 6, it is assumed that no on/off state data is outputted for a button until all required decay time samples are acquired. Thus, if S=32 (i.e., 32 decay time samples are required per button for decay time sample averaging purposes), the on/off state data for that button is outputted only after at least a period equal to 32 decay time samples times the number of buttons to be sensed are acquired. In a later discussion herein, another scheme will be discussed in which on/off state data for a button may be produced even if only a subset of the required decay time samples is available.

The method of FIG. 6 may start with step 602, in which the processor/controller of the user interface system may set the number of decay time samples equal to S. As mentioned, the number of sampling cycles S represents the number of decay time samples utilized for decay time sample averaging purposes to mitigate the effect of transient noise.

In this example, it is assumed that one decay time sample will be acquired for each button during a sampling cycle. Thus, S cycles will be required to acquire all the required decay time samples for the buttons. For example, if 32 decay time samples are required for button 1 for decay time sample averaging purposes, and one decay time sample is obtained during a sampling cycle, 32 sampling cycles will be required before button 1 acquires all its 32 required decay time samples.

To track the sampling cycles, a counter c may be employed. In step 602, the processor/controller may set a cycle counter "c" to be 0, for running the first cycle.

In steps 606-610, the user interface system may acquire one decay time sample for each button utilizing a timer/counter during a sampling cycle.

One decay time sample is acquired for each button during the sampling cycle (e.g., cycle 0, or the first sampling cycle). For example, in step 606, the timer/counter may acquire a decay time sample t(0,c) for button 0, i.e., the first button, during the sampling cycle tracked by the counter "c". In step 608, the timer/counter may acquire a decay time sample t(1,c) for button 1, i.e., the second button, during the sampling cycle tracked by the counter "c". In step 610, the timer/counter may acquire a decay time sample t(N−1,c) for button N−1, i.e., the last button (e.g., button 2, or the third button), during the sampling cycle tracked by the counter "c". Accordingly, after steps 604-610 are performed, all buttons will acquire one decay time sample in an interleaved fashion.

In step 612, the processor/controller may increment the sample/cycle counter s by 1, in preparation for the next sampling cycle.

In step 614, the processor/controller may determine whether all the sampling cycles have been completed. If not, control may be transferred back to step 604 to acquire another decay time sample for each button in the next cycle. If all the sampling cycles have been completed, control may be transferred to step 616.

In step 616, the processor/controller may process all acquired decay time samples, i.e., decay time samples t(0, 0) to t(N−1,S−1), to obtain a set of error-mitigated decay time samples $t_m(0)$ to $t_m(N-1)$ associated with buttons 0 to N−1, respectively. In one or more embodiments, step 616 may be performed by averaging decay time samples for each button to obtain an error-mitigated decay time sample for each button. The processing mitigates the effect of an error, such as a transient noise, that may affect one or more decay time samples.

In step 618, the processor/controller may utilize the error-mitigated decay time samples $t_m(0)$ to $t_m(N-1)$ obtained from step 616 to determine the on/off state of all buttons 0 to N−1. For example, the error-mitigated decay time sample of a given button may be compared against the threshold time $t_{TH}$ to determine whether the state of that button should be deemed "on" or "off."

Steps 616 and 618 may be performed for each button when all required decay time samples are acquired for that button, in an embodiment. In other words, it is not necessary to wait for all buttons to acquire their required decay time samples before on/off state determination may occur.

Although FIG. 6 shows, in accordance with one embodiment, how decay time samples may be interleaved, other implementations may be more practical and/or desired in some cases. In FIG. 6, starting from system initialization when no decay time sample is available, the on/off state for a given button is not determined (in step 618) until all required decay time samples are acquired for that button. Thus, if S=32 (i.e., 32 decay time samples are required for a button for decay time sample averaging purposes), and one decay time sample per button is obtained during a sampling cycle, 32 sampling cycles will be required from system initialization before the on/off state for that button is determined.

Figure 7:
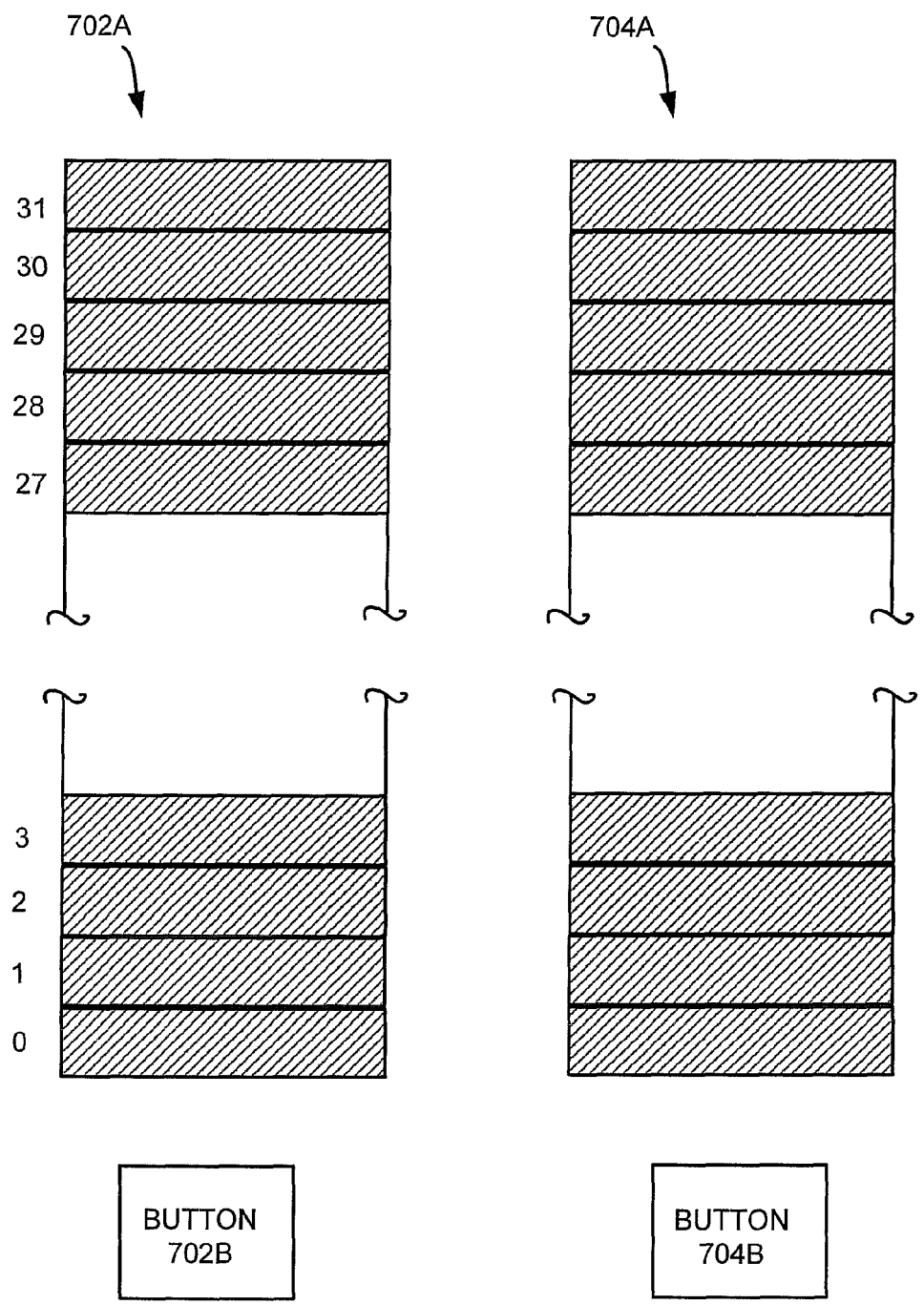
FIG. 7 illustrates, in accordance with one or more embodiments of the present invention, two example rolling arrays associated with two buttons.

This situation is depicted in example FIG. 7 in which two rolling arrays 702A and 704A associated with two buttons 702B and 704B are illustrated. In FIG. 7, the on/off state determination occurs after all 64 members within both arrays are filled. Thus, starting from system initialization, if only one decay time sample is acquired in a sampling cycle for button 702B, 32 sampling cycles need to transpire before an error-mitigated decay time sample may be obtained for button 702B and the on/off state determination may be performed for button 702B.

A variation of FIG. 6 may involve processing the acquired decay time samples for each button to obtain an error-mitigated decay time sample (which is then employed to determine the on/off state of that button) even if all required decay time samples are not yet acquired. Suppose, for example, that S=32 (i.e., 32 decay time samples are required for decay time sample averaging purposes for a button), and one decay time sample per button is obtained during a sampling cycle. Furthermore, suppose that only 4 sampling cycles have occurred after system initialization.

Instead of waiting 32 cycles to obtain the required 32 decay time samples for button 1 before calculating the error-mitigated decay time sample for button 1 (which error-mitigated decay time sample will be used to determine the on/off state of button 1), it is possible to calculate the error-mitigated decay time sample for button 1 by averaging the decay time samples over 4 cycles and using the resultant error-mitigated decay time sample to determine the on/off state of button 1. In this case, the initialization delay is reduced since on/off state determination is performed without having to wait for 32 sampling cycles to occur first. Even though the error-mitigating effect is only partial due to the fact that averaging is performed only with four decay data samples instead of the full 32 decay data samples (and thus an error in any of the four available decay data samples will have a greater effect on the on/off state determination), the tradeoff between responsiveness and accuracy may be acceptable or even desirable during the initialization period in some cases.

Figure 8:
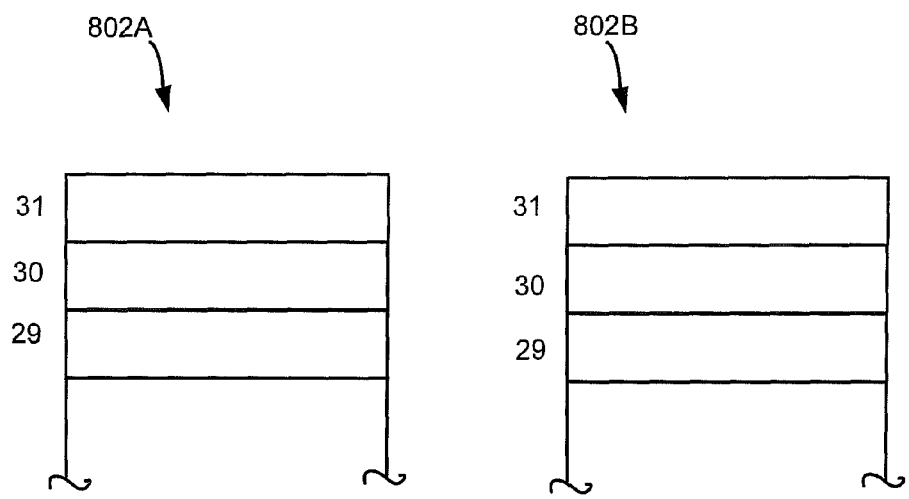
FIG. 8 illustrates, in accordance with one or more embodiments of the present invention, two example rolling arrays associated with two buttons.
Figure 8:
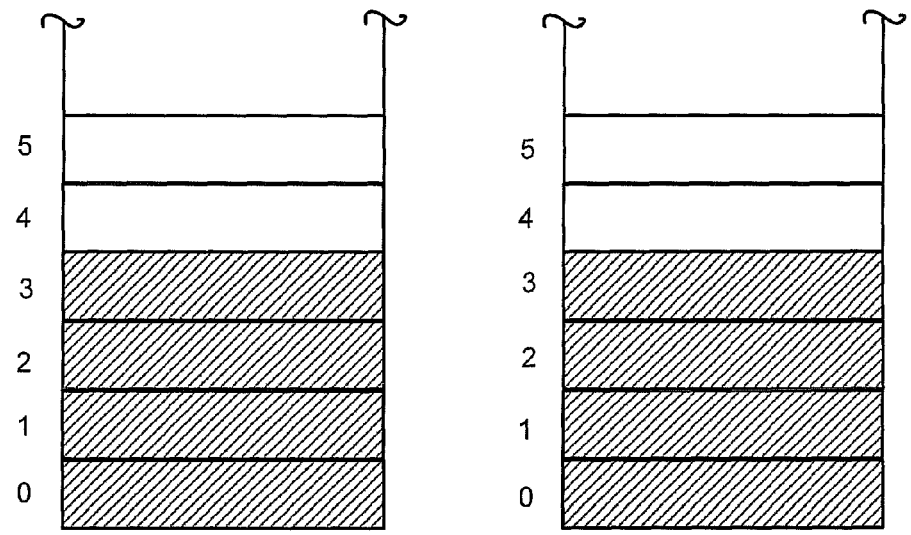

This situation is depicted in example FIG. 8 in which two rolling arrays 802A and 804A associated with two buttons 802B and 804B are illustrated. In FIG. 8, the on/off state determination occurs after each sampling cycle even though all the array members are not yet filled. This may be performed by averaging the decay sample times over the number of samples acquired, for example. Thus, starting from system initialization, on/off state determination may occur after each sampling cycle. In FIG. 8, the 4 decay sample times are averaged over four cycles, and the error-mitigated decay sample time is then compared against the threshold time $t_{TH}$ to determine the on/off state of the button.

Figure 9:
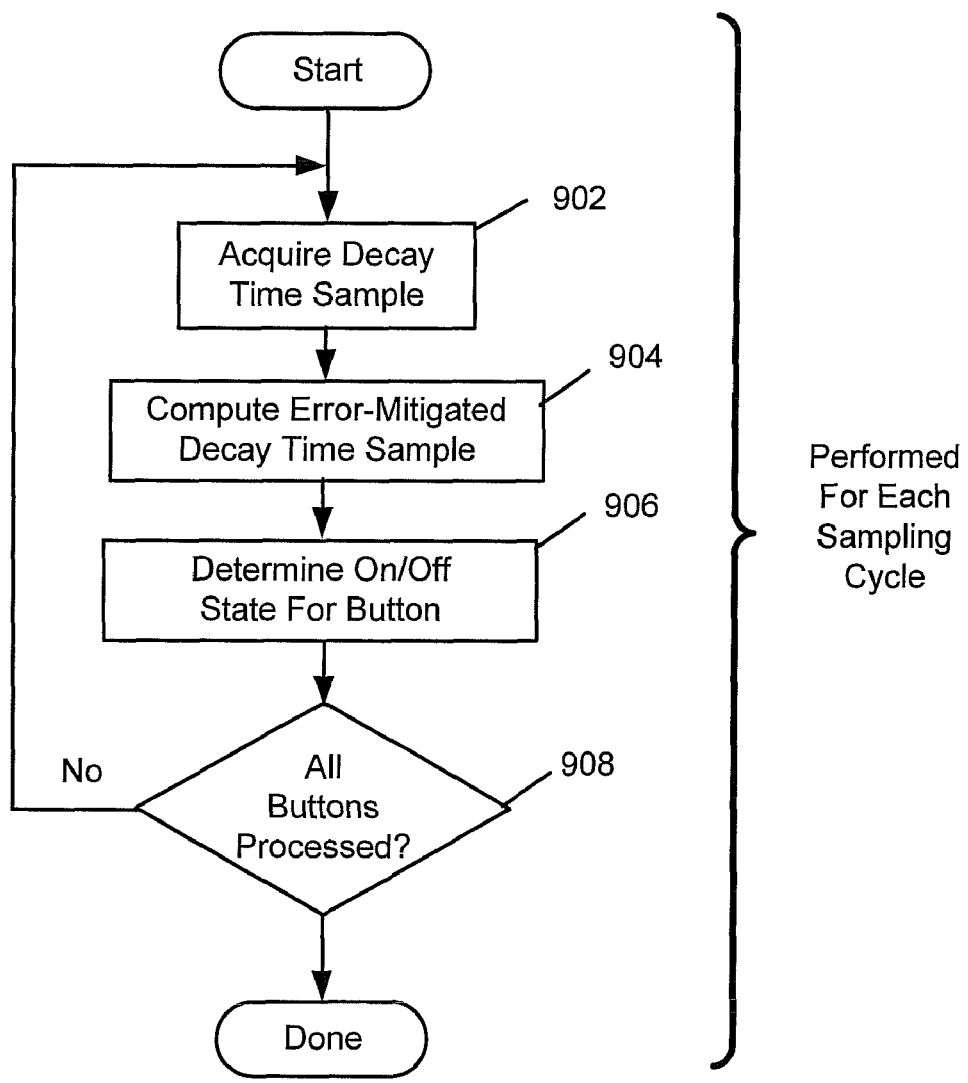
FIG. 9 illustrates, in accordance with an embodiment of the invention, steps for determining on/off state while reducing initialization delay during a given sampling cycle.

FIG. 9 shows, in accordance with an embodiment of the invention, the steps for determining on/off state while reducing initialization delay during a given sampling cycle. In step 902, the decay time sample is acquired for a button. In step 904, the error-mitigated decay time sample (e.g., average) is computed for that button. Note that in step 904, it is not necessary to fill up the entire rolling array (e.g., array 802A of FIG. 8) before the computation of the error-mitigated decay time sample can proceed. In step 906, the on/off state determination is performed for that button using the computed error-mitigated decay time sample of step 904. In step 908, it is ascertained whether decay time sampling has occurred for all buttons. If not, the method returns to step 902 to acquire a decay time sample for the next button and proceeds in a similar manner until decay time sampling has occurred for all buttons. The entire process of FIG. 9 can be performed cyclically cycle-after-cycle Other variations of FIG. 6 may be possible. For example, it is possible to fill the rolling array associated with each button with the first decay data sample and immediately calculating the error-mitigated decay sample value. As a new decay time sample is acquired in the next sampling cycle, the new decay time sample may be inserted at one end of the array and an existing decay time sample is removed from the other end of the array. Although this approach also involves some tradeoff between responsiveness and error mitigation, the improvement in responsiveness may make the tradeoff acceptable or even desirable in some cases. Over time, the rolling array would be filled with actual decay time samples, rendering the process of on/off determination more accurate.

The arrays, for example, may also be pre-filled with a value that represents the expected average between a pressed and un-pressed button prior to the first actual sample being taken so that the array is weighted neither for the pressed or un-pressed condition.

Thus far, the examples have focused on the filling of the rolling array with decay time samples in an interleaved fashion and various strategies for reducing the initialization delay in producing on/off state data for the buttons. After a rolling array is filled, a first-in-first-out strategy may be employed to replace the oldest decay time sample value with the newest decay time sample acquired in a sampling cycle.

Figure 10:
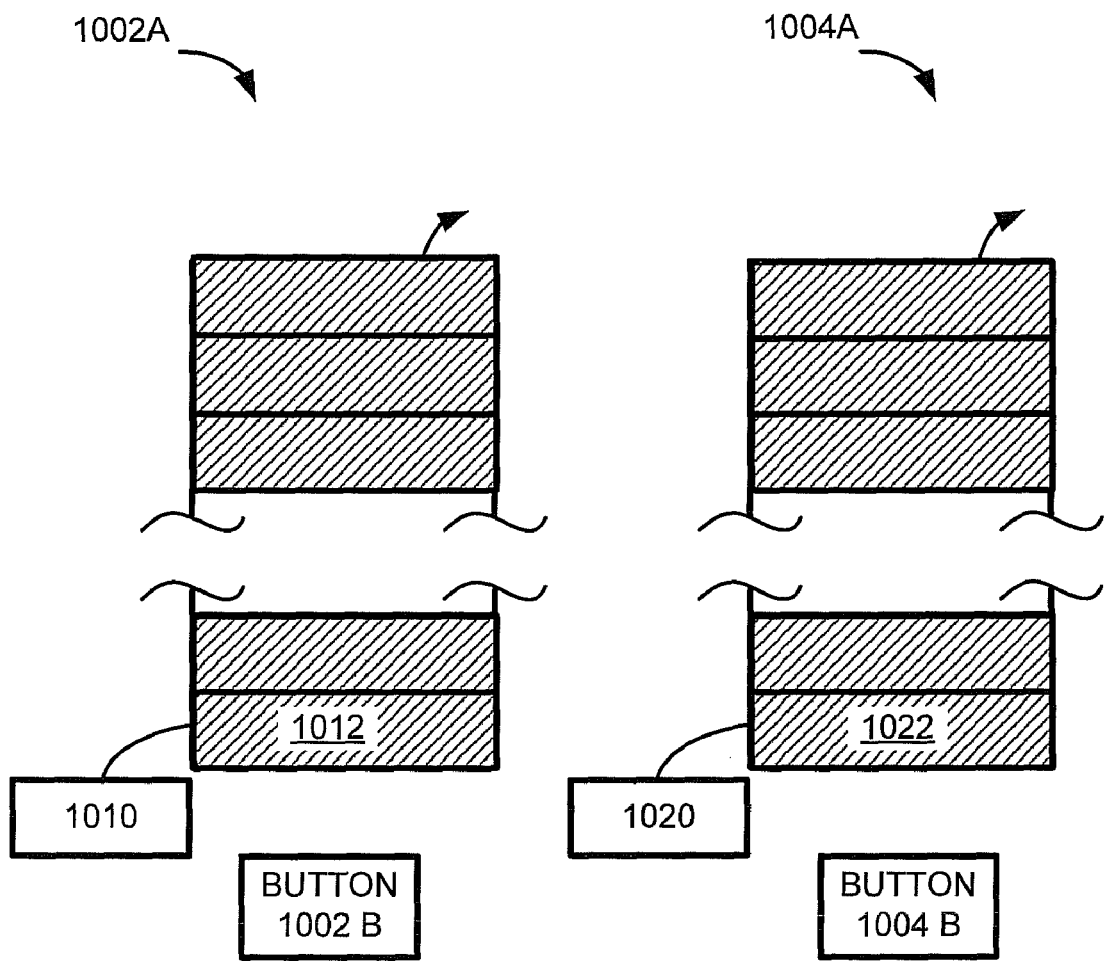
FIG. 10 illustrates, in accordance with an embodiment of the invention, two example rolling arrays associated with two buttons 1002B and 1004B.

FIG. 10 shows two example rolling arrays 1002A and 1004A associated with two buttons 1002B and 1004B. In FIG. 10, rolling arrays 1002A and 1004A are filled prior to the current sampling cycle (e.g., the situation wherein decay time sampling has been occurring for a while since initialization). As shown, newly acquired decay time sample 1010 replaces the oldest decay time sample 1012 in rolling array 1002A during the current cycle. Further, newly acquired decay time sample 1020 replaces the oldest decay time sample 1022 in rolling array 1004A during the current cycle. As a result, the rolling array for a given button tracks the most recently acquired set of decay time samples for that button, resulting in up-to-date and accurate on/off state determination.

As can be appreciated from the foregoing, by interleaving decay time sampling for multiple capacitive sensing elements (e.g., capacitive sensing buttons), the effect of transient noises may be more effectively mitigated since such transient-induced error is not permitted to unduly affect any single button.

Furthermore, by calculating the error-mitigated decay time sample based on available decay time samples instead of waiting until after all decay time samples are acquired, initialization delay may be minimized. In this manner, the user may perceive improved responsiveness during the time period immediately after system initialization.

Additionally, the use of rolling arrays, lists, linked lists, or other similarly suitable data structures to track the set of most recently acquired decay time samples (by replacing the oldest decay time sample with the newest decay time sample during each sampling cycle) allows embodiments of the invention to utilize the most up-to-date set of decay time data samples for the purpose of determining the on/off state for the buttons. These improvements, employed singularly or in combination, result in improved accuracy and/or improved responsiveness and/or improved robustness to transient-induced errors and/or reduced false positive and false negatives.

While this invention has been described in terms of several embodiments, there are alterations, permutations, and equivalents, which fall within the scope of this invention. For example, although the examples discuss the acquisition of one decay time sample for each button during each sampling cycle, it is possible to acquire two or more decay time samples for each button during each sampling cycle. As another example, although averaging is employed as a method for mitigating transient-induced errors, other mathematical or statistical approaches for mitigating transient-induced error in a group of decay time samples may also be employed. As yet another example, although the error-mitigated decay time sample is employed to determine the on/off state of a button, it is also possible to compute or ascertain more than two operating states (e.g., more than just on or off) from the mitigated decay time sample. If multiple thresholds are employed, for example, it is possible to determine various operating states or conditions of a button based on the computed error-mitigated decay time sample.

It should also be noted that there are many alternative ways of implementing the methods and apparatuses of the present invention. Furthermore, embodiments of the present invention may find utility in other applications or in similar applications that utilize different button mechanisms, e.g. inductive buttons instead of capacitive buttons. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. In an electronic device, a method for determining operating states of a plurality of capacitive sensing elements, said plurality of capacitive-sensing elements including at least a first capacitive sensing element and a second capacitive sensing element, said first capacitive sensing element having an associated first steady-state number of decay time samples employed for determining an operating state of said first capacitive sensing element during steady-state operation, said second capacitive sensing element having an associated second steady-state number of decay time samples employed for determining an operating state of said second capacitive sensing element during said steady-state operation, comprising:

acquiring, in an interleaved manner, a first plurality of decay time samples for said first capacitive sensing element and said second capacitive sensing element, wherein a maximum consecutive number of decay time samples acquired for said first capacitive sensing element in said first plurality of decay time samples is less than said first steady-state number of decay time samples and wherein a maximum consecutive number of decay time samples acquired for said second capacitive sensing element in said first plurality of decay time samples is less than said second steady-state number of decay time samples; and determining said operating state of said first capacitive sensing element using at least decay time samples acquired for said first capacitive sensing element in said first plurality of decay time samples, wherein said operating state of said first capacitive sensing element affects an operating characteristic of at least one function of said electronic device.

2. The method of claim 1 wherein said determining said operating state of said first capacitive sensing element includes computing a first error-mitigated decay time sample that factors in at least said decay time samples acquired for said first capacitive sensing element in said first plurality of decay time samples.

3. The method of claim 1 wherein said determining said operating state for said first capacitive sensing element occurs before a number of said decay time samples acquired for said first capacitive sensing element in said first plurality of decay time samples equals or exceeds said first steady-state number of decay time samples.

4. The method of claim 1 wherein said determining said operating state for said first capacitive sensing element occurs after a number of said decay time samples acquired for said first capacitive sensing element in said first plurality of decay time samples at least equals said first steady-state number of decay time samples.

5. In an electronic device, a method for determining operating states of a plurality of capacitive sensing elements, said plurality of capacitive-sensing elements including at least a first capacitive sensing element and a second capacitive sensing element, an operating state of said first capacitive sensing element being determined based on a first steady-state number of decay time samples acquired for said first capacitive sensing element, an operating state of said second capacitive sensing element being determined based on a second steady-state number of decay time samples acquired for said second capacitive sensing element, comprising:

a) acquiring, in a first sampling cycle, a first number of decay time samples for said first capacitive sensing element and a second number of decay time samples for said second capacitive sensing element, wherein said first number of decay time samples is less than said first steady-state number of decay time samples, and said second number of decay time samples is less than said second steady-state number of decay time samples;

b) acquiring, in a second sampling cycle, a third number of decay time samples for said first capacitive sensing element and a fourth number of decay time samples for said second capacitive sensing element, wherein said third number of decay time samples is less than said first steady-state number of decay time samples, and said fourth number of decay time samples is less than said second steady-state number of decay time samples;

c) computing a first error-mitigated decay time sample value based at least on decay time samples acquired in said first number of decay time samples and in said third number of decay time samples; and d) determining said operating state of said first capacitive sensing element based on said first error-mitigated decay time sample, wherein said operating state of said first capacitive sensing element affects an operating characteristic of at least one function of said electronic device, wherein said steps c) and d) are performed only after a number of decay time samples actually acquired for said first capacitive sensing element at least equals to said first steady-state number of decay time samples.

6. The method of claim 5 wherein said computing said first error-mitigated decay time sample includes performing an average operation that factors in at least said decay time samples acquired in said first number of decay time samples and in said third number of decay time samples.

7. The method of claim 5 wherein said first number of decay time samples is one.

8. The method of claim 7 wherein said second number of decay time samples is one.

9. The method of claim 5 wherein said decay time samples actually acquired for said capacitive sensing element are tracked in a rolling array, at least one decay time sample newly acquired for said first capacitive sensing element replacing at least one old decay time sample stored in said rolling array during each sampling cycle.

10. The method of claim 5 wherein said electronic device is a cellular handset and said first capacitive sensing element implements a button on said cellular handset.

11. The method of claim 5 wherein said operating states represent on/off states.

12. In an electronic device, a method for determining operating states of a plurality of capacitive sensing elements, said plurality of capacitive-sensing elements including at least a first capacitive sensing element and a second capacitive sensing element, said first capacitive sensing element having an associated first steady-state number of decay time samples employed for determining an operating state of said first capacitive sensing element during steady-state operation, said second capacitive sensing element having an associated second steady-state number of decay time samples employed for determining an operating state of said second capacitive sensing element during said steady-state operation, comprising:

a) acquiring, in a first sampling cycle, a first number of decay time samples for said first capacitive sensing element and a second number of decay time samples for said second capacitive sensing element, wherein said first number of decay time samples is less than said first steady-state number of decay time samples, and said second number of decay time samples is less than said second steady-state number of decay time samples;

b) acquiring, in a second sampling cycle, a third number of decay time samples for said first capacitive sensing element and a fourth number of decay time samples for said second capacitive sensing element, wherein said third number of decay time samples is less than said first steady-state number of decay time samples, and said fourth number of decay time samples is less than said second steady-state number of decay time samples;

c) computing a first error-mitigated decay time sample value based at least on decay time samples acquired in said first number of decay time samples and in said third number of decay time samples; and d) determining said operating state of said first capacitive sensing element based on said first error-mitigated decay time sample, wherein said operating state of said first capacitive sensing element affects an operating characteristic of at least one function of said electronic device.

13. The method of claim 12 wherein said computing said first error-mitigated decay time sample includes performing an average operation that factors in at least said decay time samples acquired in said first number of decay time samples and in said third number of decay time samples.

14. The method of claim 12 wherein said first number of decay time samples is one.

15. The method of claim 14 wherein said second number of decay time samples is one.

16. The method of claim 12 further comprising obtaining decay time samples for said first capacitive sensing element in at least one additional sampling cycle, wherein said step c) and d) are performed only after a number of decay time samples actually acquired for said first capacitive sensing element at least equals to said first steady-state number of decay time samples.

17. The method of claim 12 wherein said decay time samples actually acquired for said capacitive sensing element are tracked in a rolling data structure, at least one decay time sample newly acquired for said first capacitive sensing element replacing at least one old decay time sample stored in said rolling array during each sampling cycle.

18. The method of claim 12 wherein said electronic device is a cellular handset and said first capacitive sensing element implements a button on said cellular handset.

19. The method of claim 12 wherein said steps c) and d) are performed even before a number of decay time samples actually acquired for said first capacitive sensing element equals said first steady-state number of decay time samples.

20. The method of claim 12 wherein said operating states represent on/off states.

* * * * *